United States Patent
Lu et al.

(10) Patent No.: US 7,995,979 B2
(45) Date of Patent: Aug. 9, 2011

(54) WIRELESS RECEIVER WITH AUTOMATIC GAIN CONTROL AND METHOD FOR AUTOMATIC GAIN CONTROL OF RECEIVING CIRCUIT UTILIZED IN WIRELESS RECEIVER

(75) Inventors: Chao-Hsin Lu, Tao-Yuan Hsien (TW); Chang-Fu Kuo, Hsin-Chu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 753 days.

(21) Appl. No.: 12/041,664

(22) Filed: Mar. 4, 2008

(65) Prior Publication Data
US 2009/0227222 A1  Sep. 10, 2009

(51) Int. Cl.
*H04B 17/02* (2006.01)
*H04B 7/00* (2006.01)

(52) U.S. Cl. .......... 455/234.1; 455/138; 455/232.1; 455/136

(58) Field of Classification Search .......... 455/136, 455/138, 232.1, 239.1, 240.1, 250.1, 130, 455/234.1
See application file for complete search history.

(56) References Cited

U.S. PATENT DOCUMENTS

| | | | |
|---|---|---|---|
| 6,670,914 B1 | 12/2003 | Najarian et al. | |
| 6,807,406 B1 * | 10/2004 | Razavi et al. | 455/313 |
| 6,831,957 B2 * | 12/2004 | Chen | 375/345 |
| 6,856,794 B1 | 2/2005 | Tso et al. | |
| 6,983,135 B1 * | 1/2006 | Tsai et al. | 455/234.1 |
| 7,127,222 B2 * | 10/2006 | Kim et al. | 455/232.1 |
| 7,257,385 B2 * | 8/2007 | Ono et al. | 455/232.1 |
| 7,650,132 B2 * | 1/2010 | Darabi | 455/333 |
| 7,668,517 B2 * | 2/2010 | Li | 455/136 |
| 2008/0160947 A1 * | 7/2008 | Xin et al. | 455/247.1 |

* cited by examiner

*Primary Examiner* — Sonny Trinh
(74) *Attorney, Agent, or Firm* — Winston Hsu; Scott Margo

(57) ABSTRACT

A wireless receiver with automatic gain control and a method for automatic gain control of a receiving circuit utilized in a wireless receiver are provided. The receiving circuit includes a programmable gain amplifier and a low noise amplifier, and the method includes: comparing a gain code of the programmable gain amplifier with a predetermined code range, wherein the gain code is determined by a frequency signal received through the low noise amplifier; and adjusting a gain of the low noise amplifier when the gain code is out of the predetermined code range.

23 Claims, 8 Drawing Sheets though the following terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

WIRELESS RECEIVER WITH AUTOMATIC GAIN CONTROL AND METHOD FOR AUTOMATIC GAIN CONTROL OF RECEIVING CIRCUIT UTILIZED IN WIRELESS RECEIVER

BACKGROUND OF THE INVENTION

The invention relates to a method and apparatus for automatic gain control of a receiving circuit in a wireless receiver, and more particularly, to a method and apparatus for automatic gain control of a Radio Frequency Integrated Circuit (RFIC) in a Global Navigation Satellite System (GNSS) receiver.

The GNSS system is a recent system well known in the art and commonly used to determine the geodetic latitude and longitude coordinates of mobile vehicles. The current GNSS system includes Global Positioning System (GPS), Galileo, GLONASS and other satellite positioning technologies. For simplicity, a GPS receiver will be discussed herein as an example of a GNSS receiver, wherein the terms "GNSS" and "GPS" may be used interchangeably.

In general, an RFIC in a GPS receiver is designed to provide a predetermined total gain. For example, the predetermined total gain can be set to 100 dB. However, gains of some components operating at high frequency in the RFIC, such as low noise amplifier(s) and mixer(s), often change due to various factors such as process variation or circuit design, and this phenomenon will result in a poor operating point of a programmable gain amplifier, thereby degrading the performance of the RFIC.

In addition, an external low noise amplifier may be required to couple to the RFIC in the GPS receiver in order to reduce the whole noise figure of the RFIC under certain conditions. Although the actual total gain of the RFIC will be reduced after the external low noise amplifier is coupled to the RFIC, the mentioned problem of unacceptable operating points for the programmable gain amplifier and the RFIC will still exist due to unstable gain variations of the components operating at high frequency in the RFIC such as low noise amplifier(s) and mixer(s).

Therefore, an efficient and economical scheme for automatic gain control of the RFIC in the GPS receiver is required.

SUMMARY OF THE INVENTION

It is therefore one of the objectives of the present invention to provide a wireless receiver with auto gain controller and a method for automatic gain control of a receiving circuit utilized in the wireless receiver, to solve the above problem.

According to an embodiment of the present invention, a method for automatic gain control of a receiving circuit utilized in a wireless receiver is disclosed. The receiving circuit comprises a programmable gain amplifier and a low noise amplifier, and the method comprises: comparing a gain code of the programmable gain amplifier with a predetermined code range, wherein the gain code is determined by a frequency signal received through the low noise amplifier; and adjusting a gain of the low noise amplifier when the gain code is out of the predetermined code range.

According to an embodiment of the present invention, a method for automatic gain control of a receiving circuit utilized in a wireless receiver is further disclosed. The receiving circuit comprises a programmable gain amplifier and a mixer module, and the method comprises: comparing a gain code of the programmable gain amplifier with a predetermined code range, wherein the gain code is determined by a frequency signal received through the mixer module; and adjusting a gain of the mixer module when the gain code is out of the predetermined code range.

According to an embodiment of the present invention, a wireless receiver with automatic gain control is disclosed. The wireless receiver comprises a receiving circuit and a control circuit, wherein the receiving circuit comprises a low noise amplifier, a mixer module, and a programmable gain amplifier. The low noise amplifier is utilized for amplifying a radio frequency signal. The mixer module is utilized for processing the amplified radio frequency signal to generate an intermediate frequency signal. The programmable gain amplifier is utilized for amplifying the intermediate frequency signal with a gain corresponding to a gain code. The control circuit is utilized for comparing the gain code with a predetermined code range and adjusting a gain of the low noise amplifier when the gain code is out of the predetermined code range.

According to an embodiment of the present invention, a wireless receiver with automatic gain control is further disclosed. The wireless receiver comprises a receiving circuit and a control circuit, wherein the receiving circuit comprises a mixer module and a programmable gain amplifier. The mixer module is utilized for processing a radio frequency signal to generate an intermediate frequency signal. The programmable gain amplifier is utilized for amplifying the intermediate frequency signal with a gain corresponding to a gain code. The control circuit is utilized for comparing the gain code with a predetermined code range and adjusting a gain of the mixer module when the gain code is out of the predetermined code range.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "include", "including", "comprise", and "comprising" are used in an open-ended fashion, and thus should be interpreted to mean "including, but not limited to . . . ." The terms "couple" and "coupled" are intended to mean either an indirect or a direct electrical connection. Thus, if a first device couples to a second device, that connection may be through a direct electrical connection, or through an indirect electrical connection via other devices and connections.

For simplicity, a wireless receiver, such as a Global Positioning System (GPS), receiver will be discussed herein as an example of a GNSS receiver, wherein the terms "GNSS" and "GPS" may be used interchangeably. However, it will be understood by one skilled in the art that the present invention is not restricted to a GPS device and may be applicable to other GNSS-type devices such as the GLONASS receiver or Galileo receiver, and it still obeys the spirit of the present invention.

Figure 1:
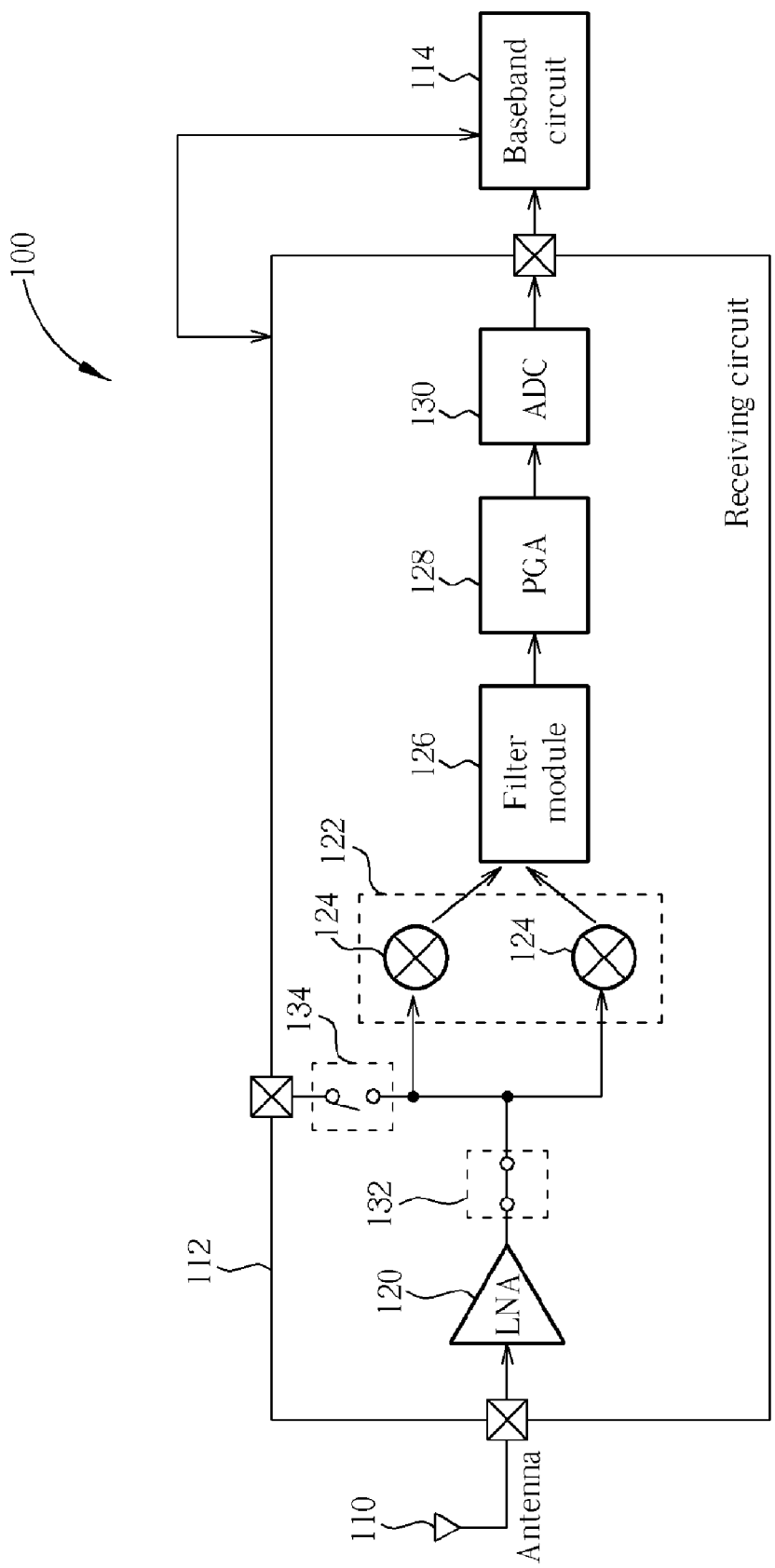
FIG. 1 shows a simplified block diagram of a GPS receiver according to a first embodiment of the present invention.

FIG. 1 shows a simplified block diagram of a GPS receiver 100 according to a first embodiment of the present invention. The GPS receiver 100 includes an antenna module 110, a receiving circuit 112, and a baseband circuit 114. The receiving circuit 112 includes a low noise amplifier (LNA) 120, a mixer module 122 having two mixers 124, a filter module 126, a programmable gain amplifier (PGA) 128, an Analog-to-Digital Converter (ADC) 130, a first switch 132, and a second switch 134. For example, the receiving circuit 112 can be a Radio Frequency Integrated Circuit (RFIC), and the filter module 126 can include an image rejection filter (not shown) such as a passive poly-phase filter or an active poly-phase filter, and a channel select filter (not shown). The low noise amplifier 120 is utilized for amplifying a radio frequency signal, which may be received by the antenna module 110. The mixer module 122 is utilized for processing the amplified radio frequency signal to generate an intermediate frequency signal. The programmable gain amplifier 128 is utilized for amplifying the intermediate frequency signal with a gain corresponding to a gain code. The baseband circuit 114, which serves as a control circuit in this embodiment, is utilized for comparing the gain code with a predetermined code range and adjusting a gain of the low noise amplifier 120 or/and a gain of the mixer module 122 when the gain code is out of the predetermined code range. Of course, this example mentioned above is only for illustrative purposes, but is not a limitation of the present invention. In addition, the receiving circuit 112 and the baseband circuit 114 also can be integrated to be a SOC or be separated into different integrated circuit parts. It should be noted that only the components pertinent to the present invention are shown for simplicity.

In this embodiment, the first switch 132 is turned on and the second switch 134 is turned off when the GPS receiver 100 is in operation. A total gain of the receiving circuit 112 is designed to a predetermined value, and therefore the sum of gains of the low noise amplifier 120, the mixer module 122, the filter module 126, and the programmable gain amplifier 128 is required to be substantially equal to the predetermined total gain. For example, the predetermined total gain is set to 100 dB for the following embodiments. Of course, the predetermined total gain mentioned above is only given for illustrative purposes, and is not a limitation of the present invention.

Firstly, the predetermined code range of the programmable gain amplifier 128 is defined by a first limit value and a second limit value, and the predetermined code range of the programmable gain amplifier 128 is stored in the baseband circuit 114 which serves as a control circuit to set a gain of the low noise amplifier 120, wherein the first limit value is not smaller than the second limit value. That is, the first limit value defines an upper bound, while the second limit value defines a lower bound. Please note that the first limit value and the second limit value respectively correspond to a first gain and a second gain of the programmable gain amplifier 128, and the first gain and the second gain can be determined by field trials. For example, a field trial may indicate that the first gain can be 50 dB and the second gain can be 30 dB since the range between 30 dB and 50 dB are suitable for the operating of programmable gain amplifier 128 and receiving circuit 112. In other words, the predetermined code range corresponds to an operating gain range of the programmable gain amplifier 128. After the first gain and the second gain are identified, the first limit value and the second limit value are determined accordingly. Of course, these gains mentioned above are only for illustrative purposes, but are not limitations of the present invention.

An exemplary embodiment for automatic gain control of the receiving circuit 112 utilized in the GPS receiver 100 compares a gain code of the programmable gain amplifier 128 with the predetermined code range, wherein the gain code is determined by a frequency signal received through the low noise amplifier 120.

Next, when a gain code of the programmable gain amplifier 128 is out of the predetermined code range between the first limit value and the second limit value (i.e. a gain of the programmable gain amplifier 128 is out of the range between the first gain and the second gain), the exemplary embodiment will utilize the control circuit, e.g. the baseband circuit 114, to adjust a gain of the low noise amplifier 120 in order to make the gain code of the programmable gain amplifier 128 set back into the range between the first limit value and the second limit value, and thus the gain of the programmable gain amplifier 128 is set back into the range between the first gain and the second gain. In other words, the exemplary embodiment adjusts the gain of the low noise amplifier 120 according to the gain code of the programmable gain amplifier 120, thereby allowing the gain code of the programmable gain amplifier 120 to be tuned into the range delimited by the first limit value and the second limit value, i.e. the predetermined code range.

More particularly, the step of adjusting the gain of the low noise amplifier 120 includes utilizing the baseband circuit 114 to increase the gain of the low noise amplifier 120 if the gain code of the programmable gain amplifier 128 is larger than the first limit value (i.e. the gain of the programmable gain amplifier 128 is higher than the first gain), and utilizing the baseband circuit 114 to decrease the gain of the low noise amplifier 120 if the gain code of the programmable gain amplifier 128 is smaller than the second limit value (i.e. the gain of the programmable gain amplifier 128 is lower than the second gain).

Figure 2:
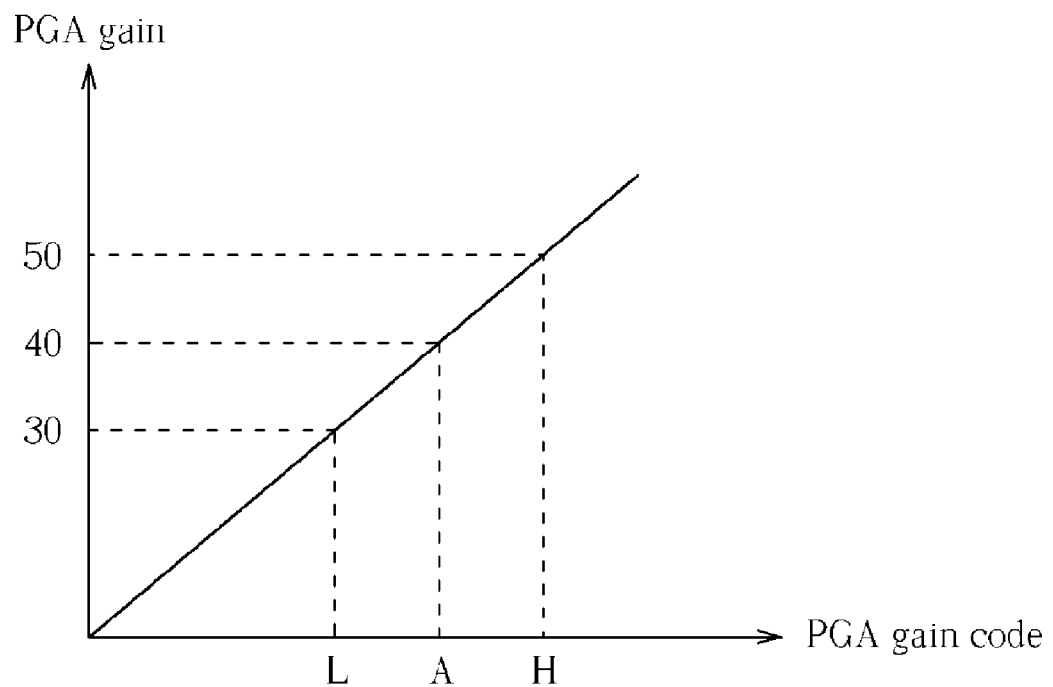
FIG. 2 shows an exemplary diagram illustrating a gain code setting of a programmable gain amplifier shown in FIG. 1.
Figure 3:
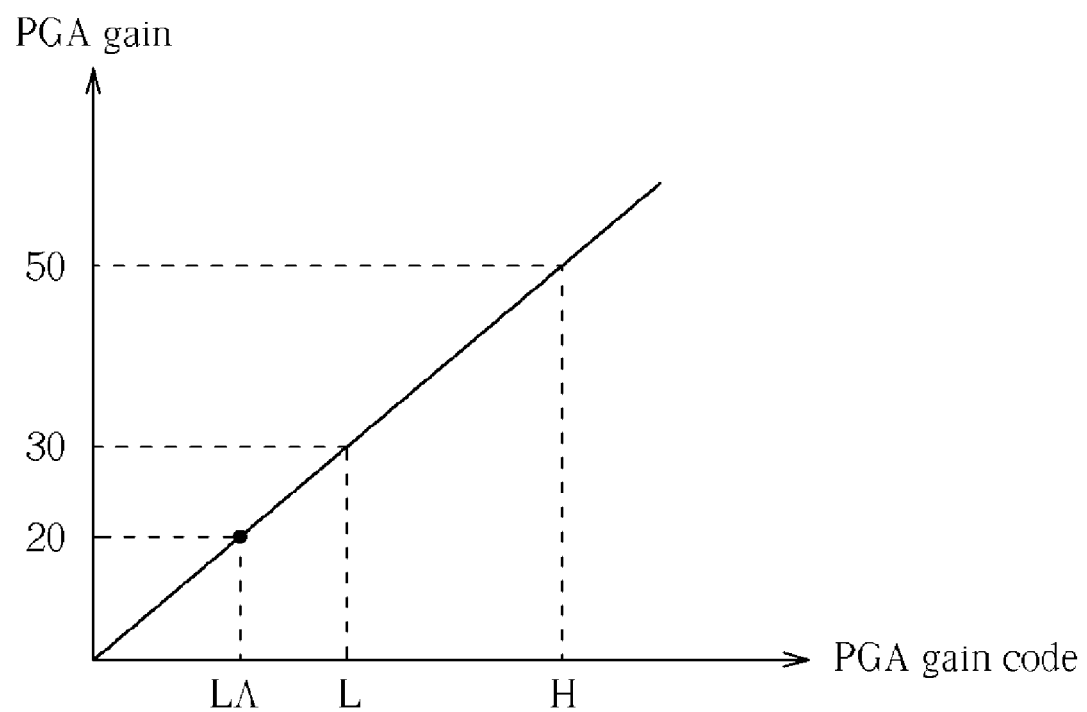
FIG. 3 shows another exemplary diagram illustrating a gain code setting of the programmable gain amplifier shown in FIG. 1.
Figure 4:
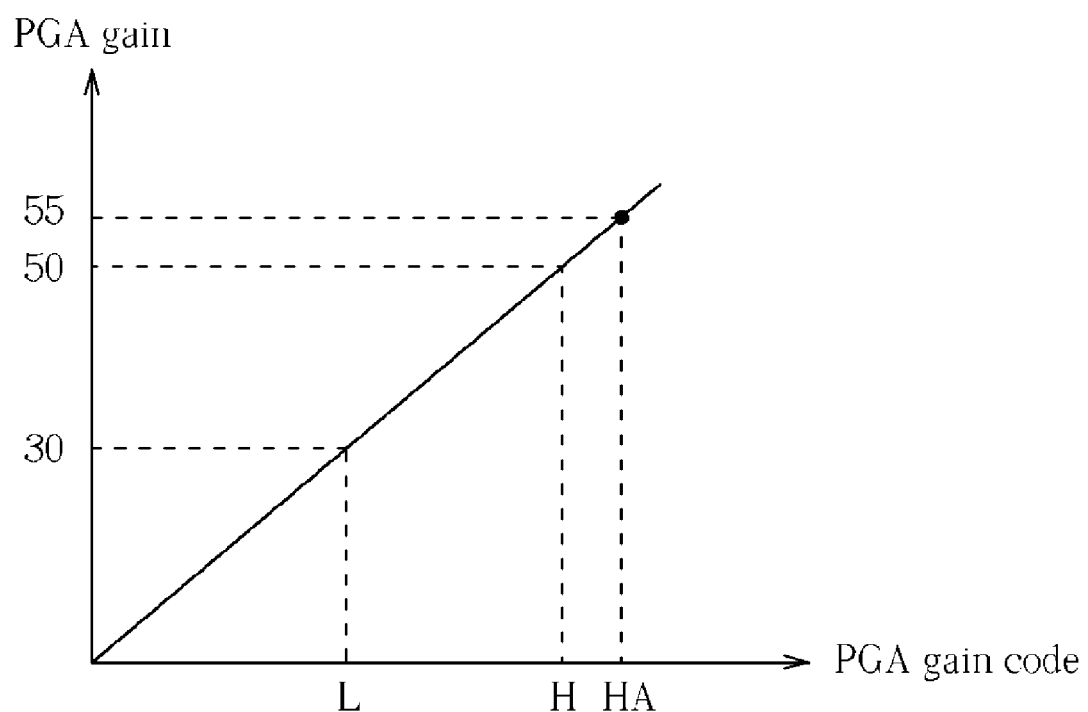
FIG. 4 shows yet another exemplary diagram illustrating a gain code setting of the programmable gain amplifier shown in FIG. 1.

FIG. 2 to FIG. 4 shows three exemplary diagrams illustrating gain code settings of the programmable gain amplifier 128 shown in FIG. 1. As shown in FIG. 2, when a field trial indicates that the first gain and the second gain of the programmable gain amplifier 128 are 50 dB and 30 dB respectively, the exemplary embodiment will define a predetermined code range of the programmable gain amplifier 128 by a first limit value H corresponding to 50 dB and a second limit value L corresponding to 30 dB, and then store the predetermined code range of the programmable gain amplifier 128 in the baseband circuit 114, e.g. store the first limit value H and the second limit value L in the baseband circuit 114.

For example, a total gain of the receiving circuit 112 utilized in the GPS receiver 100 is designed to a predetermined value of 100 dB, that is, gains of the low noise amplifier 120, the mixer module 122, the filter module 126, and the programmable gain amplifier 128 may be respectively designed to be 20 dB, 20 dB, 20 dB, and 40 dB. Therefore the gain of the programmable gain amplifier 128 falls within the range between 30 dB and 50 dB as shown in FIG. 2 (i.e. the gain code set to the programmable gain amplifier 128 is A which is not out of the predetermined code range between the first limit value H and the second limit value L).

In a case where the gain of the low noise amplifier 120 changes to 40 dB due to some factors, such as process variation or circuit design, then the gain of the programmable gain amplifier 128 will be changed to 20 dB as shown in FIG. 3, and therefore the gain code of the programmable gain amplifier 128 will be LA which is smaller than the second limit value L (i.e. the gain code of the programmable gain amplifier 128 is out of the predetermined code range stored in the baseband circuit 114). After the baseband circuit 114 detects that the gain code of the programmable gain amplifier 128 is smaller than the second limit value L, the exemplary embodiment will utilize the baseband circuit 114 to decrease the gain of the low noise amplifier 120 until the gain code of the programmable gain amplifier 128 moves back into the predetermined code range stored in the baseband circuit 114. Similarly, if a variation of the gain of the mixer module 122 or of both the gains of the low noise amplifier 120 and the mixer module 122 results in the gain code of the programmable gain amplifier 128 becoming smaller than the second limit value L, the exemplary embodiment will utilize the baseband circuit 114 to decrease the gain of the low noise amplifier 120 until the gain code of the programmable gain amplifier 128 moves back into the predetermined code range stored in the baseband circuit 114.

In another case where the gain of the low noise amplifier 120 changes to 5 dB due to some factors such as process variation or circuit design, the gain of the programmable gain amplifier 128 will be changed to 55 dB as shown in FIG. 4. Therefore the gain code of the programmable gain amplifier 128 will be HA which is larger than the first limit value H (i.e. the gain code of the programmable gain amplifier 128 is out of the predetermined code range stored in the baseband circuit 114). After the baseband circuit 114 detects that the gain code of the programmable gain amplifier 128 is larger than the first limit value H, the exemplary embodiment will utilize the baseband circuit 114 to increase the gain of the low noise amplifier 120 until the gain code of the programmable gain amplifier 128 moves back into the predetermined code range stored in the baseband circuit 114. Similarly, if a variation of the gain of the mixer module 122 or of both the gains of the low noise amplifier 120 and the mixer module 122 results in the gain code of the programmable gain amplifier 128 becoming larger than the first limit value H, the exemplary embodiment will utilize the baseband circuit 114 to increase the gain of the low noise amplifier 120 until the gain code of the programmable gain amplifier 128 moves back into the predetermined code range stored in the baseband circuit 114.

Figure 5:
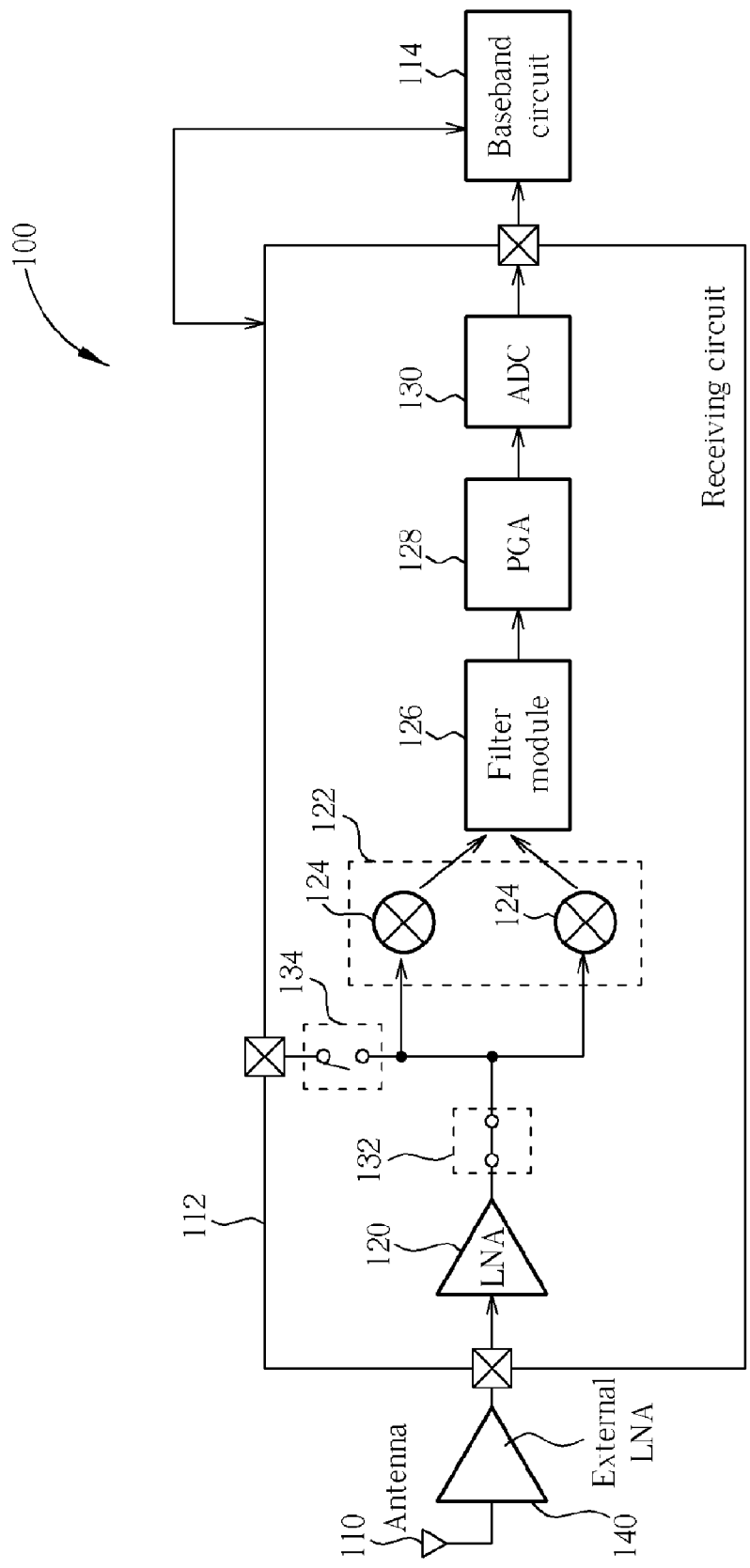
FIG. 5 shows a simplified block diagram of the GPS receiver shown in FIG. 1 further connecting an external low noise amplifier (LNA) according to a second embodiment of the present invention.

In addition, please refer to FIG. 5. FIG. 5 shows a simplified block diagram of the GPS receiver 100 shown in FIG. 1 further connecting an external low noise amplifier 140 according to a second embodiment of the present invention. As shown in FIG. 5, when the external low noise amplifier 140 is required to be configured between the antenna module 110 and the low noise amplifier 120 of the receiving circuit 112, the predetermined total gain provided by the receiving circuit 112 will be changed according to a gain of the external low noise amplifier 140. In this embodiment, the first switch 132 is turned on and the second switch 134 is turned off when the GPS receiver 100 is in operation, so as to receiving the radio frequency signal from the antenna module 110 with the external low noise amplifier 140. The baseband circuit 114 is utilized for comparing the gain code with a predetermined code range and adjusting a gain of the low noise amplifier 120, or/and a gain of the mixer module 122 when the gain code is out of the predetermined code range.

For example, a total gain of the receiving circuit 112 utilized in the GPS receiver 100 is designed to a predetermined value of 100 dB, that is, gains of the low noise amplifier 120, the mixer module 122, the filter module 126, and the programmable gain amplifier 128 may be respectively designed to be 20 dB, 20 dB, 20 dB, and 40 dB. When the external low noise amplifier 140 providing a gain of 15 dB is configured between the antenna module 110 and the low noise amplifier 120 of the receiving circuit 112, the gain provided by the receiving circuit 112 will be reduced to 85 dB, and the gains of the low noise amplifier 120, the mixer module 122, the filter module 126, and the programmable gain amplifier 128 might be changed to 30 dB, 15 dB, 20 dB, and 20 dB respectively; therefore, the gain code of the programmable gain amplifier 128 will be LA which is smaller than the second limit value L (i.e. the gain code of the programmable gain amplifier 128 is out of the predetermined code range stored in the baseband circuit 114) as shown in FIG. 3. After the baseband circuit 114 detects that the gain code of the programmable gain amplifier 128 is smaller than the second limit value L, the exemplary embodiment will utilize the baseband circuit 114 to decrease the gain of the low noise amplifier 120 until the gain code of the programmable gain amplifier 128 moves back into the predetermined code range stored in the baseband circuit 114. Of course, these gains, gain code, and predetermined code range mentioned above are only for illustrative purposes, and are not limitations of the present invention.

Similarly, if a variation of the gain of the external low noise amplifier 140, or of the mixer module 122, or of the low noise amplifier 120, or of any combination thereof results in the gain code of the programmable gain amplifier 128 becoming smaller than the second limit value L or larger than the first limit value H, the exemplary embodiment will utilize the baseband circuit 114 to decrease or increase the gain of the low noise amplifier 120 until the gain code of the programmable gain amplifier 128 moves back into the predetermined code range stored in the baseband circuit 114.

Figure 6:
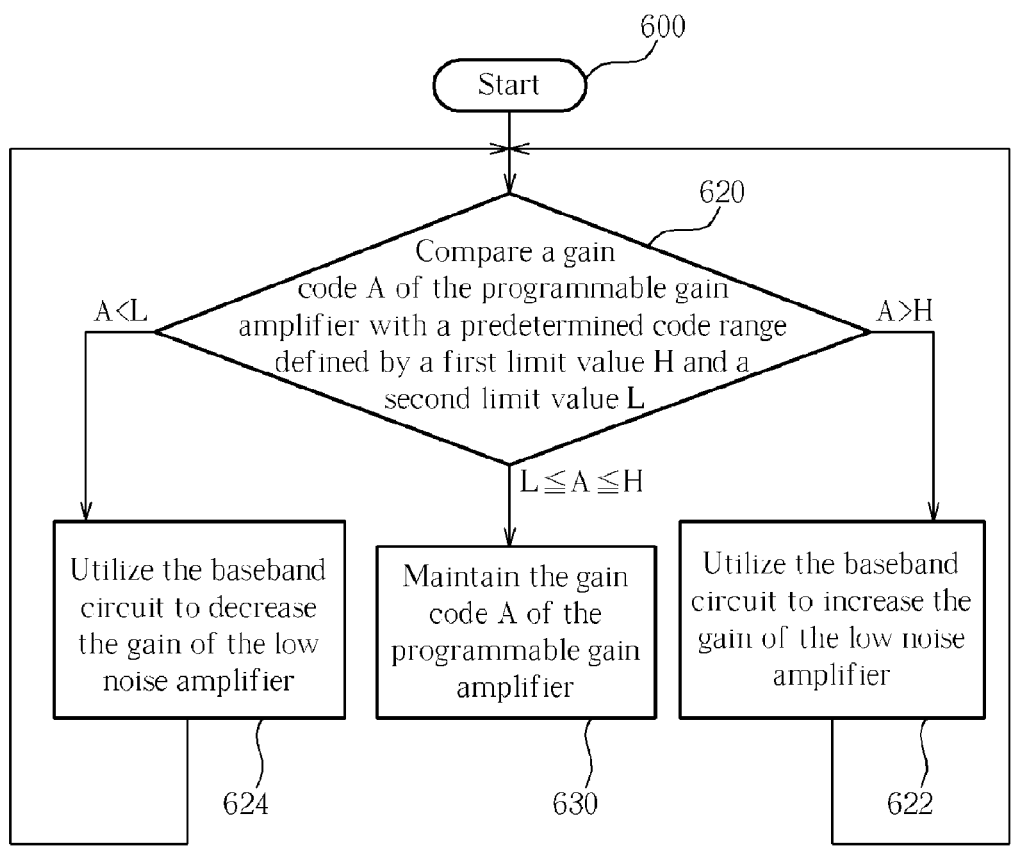
FIG. 6 is a flow chart showing an exemplary method for automatic gain control applied to a receiving circuit in a GPS receiver according to the first and second embodiments shown in FIG. 1 and FIG. 5 respectively.

To summarize the above operations concisely, please refer to FIG. 6. FIG. 6 is a flow chart showing an exemplary method for automatic gain control of a receiving circuit in a GPS receiver according to the first and second embodiments shown in FIG. 1 and FIG. 5 respectively. Provided that substantially the same result is achieved, the steps of the process flow chart need not be in the exact order shown and need not be contiguous, that is, other steps can be intermediate. The automatic gain control flow comprises the following steps:

Step 600: Start.

Step 620: Compare a gain code A of the programmable gain amplifier with a predetermined code range defined by a first limit value H and a second limit value L. If the gain code A is larger than the first limit value H, then go to step 622; if the gain code A is smaller than the second limit value L, then go to step 624; if the gain code A falls in the predetermined code range delimited by the first limit value H and the second limit value L, then go to step 630.

Step 622: Utilize the baseband circuit to increase the gain of the low noise amplifier, and then go back to step 620.

Step 624: Utilize the baseband circuit to decrease the gain of the low noise amplifier, and then go back to step 620.

Step 630: Maintain the gain code A of the programmable gain amplifier, and then go back to step 620 to keep monitoring the gain code A, if necessary.

Figure 7:
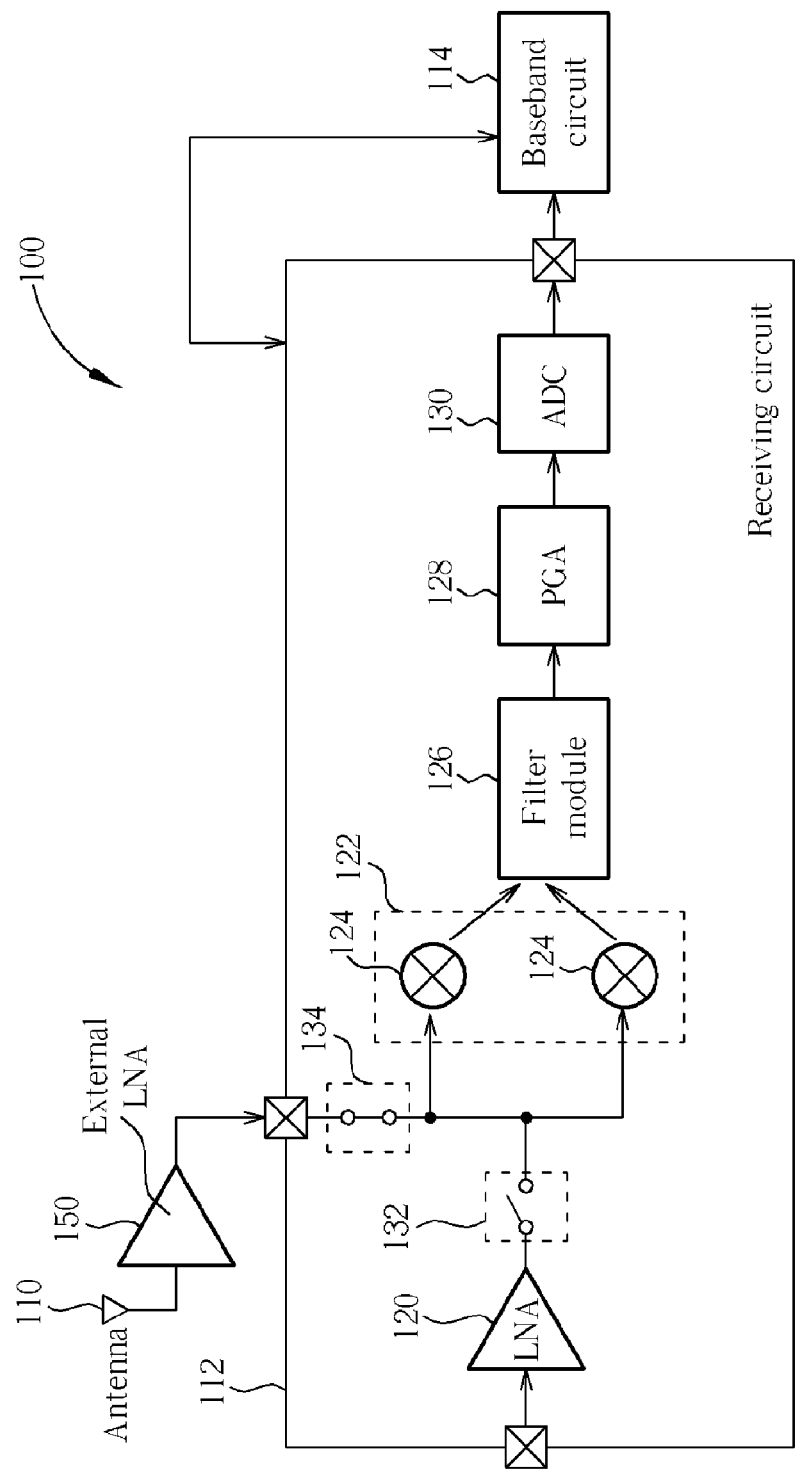
FIG. 7 shows a simplified block diagram of the GPS receiver shown in FIG. 1 further connecting an external low noise amplifier according to a third embodiment of the present invention.

Next, FIG. 7 shows a simplified block diagram of the GPS receiver 100 shown in FIG. 1 further connecting an external low noise amplifier 150 according to a third embodiment of the present invention. As shown in FIG. 7, when the external low noise amplifier 150 is required to be configured between the antenna module 110 and the mixer module 122 of the receiving circuit 112, the predetermined total gain provided by the receiving circuit 112 will be changed according to a gain of the external low noise amplifier 150. In this embodiment, the second switch 134 is turned on and the first switch 132 is turned off when the GPS receiver 100 is in operation, so as to receiving the radio frequency signal from the antenna module 110 with the external low noise amplifier 150. The baseband circuit 114 is utilized for comparing the gain code with the predetermined code range and adjusting a gain of the mixer module 122 when the gain code is out of the predetermined code range.

For example, a total gain of the receiving circuit 112 utilized in the GPS receiver 100 is designed to a predetermined value of 100 dB, that is, gains of the mixer module 122, the filter module 126, and the programmable gain amplifier 128 may be respectively designed to be 40 dB, 20 dB, and 40 dB. When the external low noise amplifier 150 providing a gain of 20 dB is configured between the antenna module 110 and the mixer module 122 of the receiving circuit 112, the gain provided by the receiving circuit 112 will be reduced to 80 dB, and the gains of the mixer module 122, the filter module 126, and the programmable gain amplifier 128 might be changed to 40 dB, 20 dB, and 20 dB respectively; therefore, the gain code of the programmable gain amplifier 128 will be LA which is smaller than the second limit value L (i.e. the gain code of the programmable gain amplifier 128 is out of the predetermined code range stored in the baseband circuit 114) as shown in FIG. 3. After the baseband circuit 114 detects that the gain code of the programmable gain amplifier 128 is smaller than the second limit value L, the exemplary embodiment will utilize the baseband circuit 114, which serves as a control circuit of the mixer module 122, to decrease the gain of the mixer module 122 until the gain code of the programmable gain amplifier 128 moves back into the predetermined code range stored in the baseband circuit 114. Of course, these gains, gain code, and predetermined code range mentioned above are only for illustrative purposes, and are not limitations of the present invention.

Similarly, if a variation of the gain of the external low noise amplifier 150, or of the mixer module 122, or both the gains of the external low noise amplifier 150 and the mixer module 122 result in the gain code of the programmable gain amplifier 128 becoming smaller than the second limit value L or larger than the first limit value H, the exemplary embodiment can utilize the baseband circuit 114 to decrease or increase the gain of the mixer module 122 until the gain code of the programmable gain amplifier 128 moves back into the predetermined code range stored in the baseband circuit 114.

Figure 8:
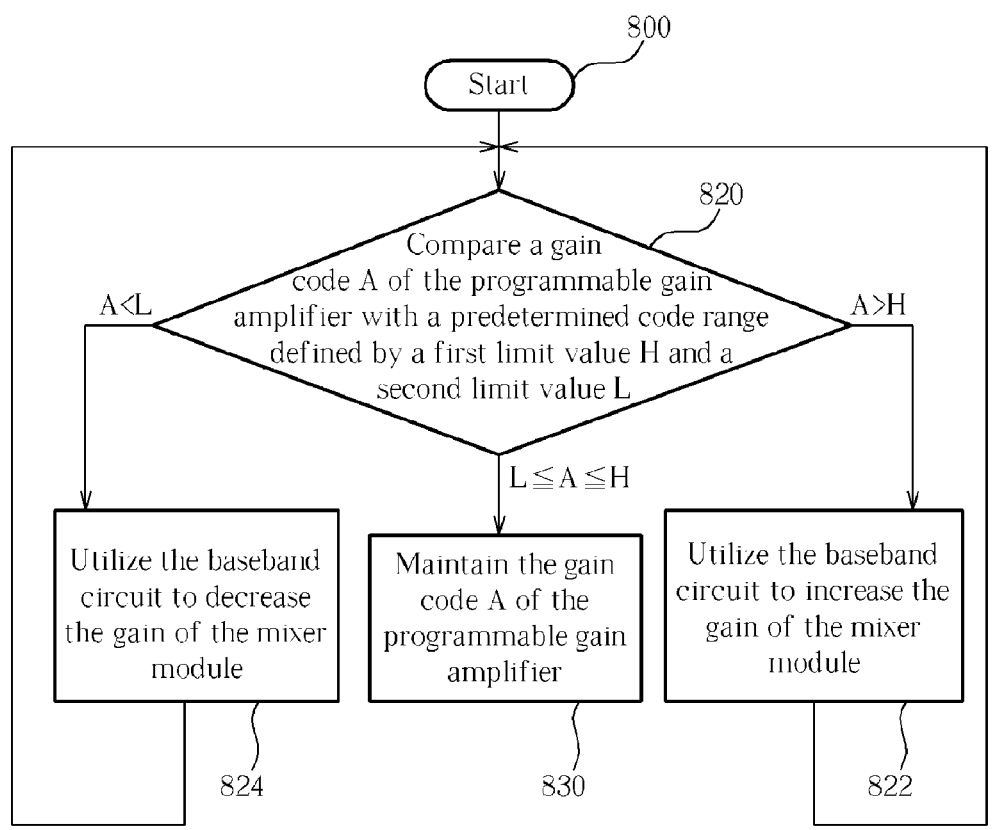
FIG. 8 is a flow chart showing an exemplary method for automatic gain control of a receiving circuit in a GPS receiver according to the third embodiment shown in FIG. 7.

To summarize the above operations concisely, please refer to FIG. 8. FIG. 8 is a flow chart showing an exemplary method for automatic gain control of a receiving circuit in a GPS receiver according to the third embodiment shown in FIG. 7. Provided that substantially the same result is achieved, the steps of the process flow chart need not be in the exact order shown and need not be contiguous, that is, other steps can be intermediate. The automatic gain control flow comprises the following steps:

Step 800: Start.

Step 820: Compare a gain code A of the programmable gain amplifier with a predetermined code range defined by a first limit value H and a second limit value L. If the gain code A is larger than the first limit value H, then go to step 822; if the gain code A is smaller than the second limit value L, then go to step 824; if the gain code A falls in the predetermined code range delimited by the first limit value H and the second limit value L, then go to step 830.

Step 822: Utilize the baseband circuit to increase the gain of the mixer module, and then go back to step 820.

Step 824: Utilize the baseband circuit to decrease the gain of the mixer module, and then go back to step 820.

Step 830: Maintain the gain code A of the programmable gain amplifier, and then go back to step 820 to keep monitoring the gain code A, if necessary.

Briefly summarized, the embodiments of the present invention offers an efficient and economical solution for automatic gain control of a receiving circuit such as an RFIC in a GPS receiver.

Those skilled in the art will readily observe that numerous modifications and alterations of the device and method may be made while retaining the teachings of the invention. Accordingly, the above disclosure should be construed as limited only by the metes and limit values of the appended claims.

What is claimed is:

1. A method for automatic gain control of a receiving circuit utilized in a wireless receiver, the receiving circuit comprising a programmable gain amplifier and a low noise amplifier, the method comprising:
    comparing a gain code of the programmable gain amplifier with a predetermined code range, wherein the gain code is determined by a frequency signal received through the low noise amplifier in operation; and
    adjusting a gain of the low noise amplifier in operation when the gain code is out of the predetermined code range;
    wherein the low noise amplifier in operation has a first gain value before the control circuit adjusts the gain of the low noise amplifier in operation, and low noise amplifier in operation has a second gain value after the control circuit adjusts the gain of the low noise amplifier in operation.

2. The method of claim 1, wherein the gain code represents a gain of the programmable gain amplifier caused by the frequency signal received through the low noise amplifier, and the predetermined code range corresponds to an operating gain range of the programmable gain amplifier.

3. The method of claim 1, wherein a total gain of the receiving circuit is designed to a predetermined value.

4. The method of claim 1, wherein the step of adjusting the gain of the low noise amplifier further comprises:
    increasing the gain of the low noise amplifier if the gain code is larger than an upper bound of the predetermined code range; and
    decreasing the gain of the low noise amplifier if the gain code is smaller than a lower bound of the predetermined code range.

5. The method of claim 1, wherein the receiving circuit is a radio frequency integrated circuit having the low noise amplifier disposed therein.

6. The method of claim 1, wherein the wireless receiver is a Global Navigation Satellite System (GNSS) receiver.

7. A method for automatic gain control of a receiving circuit utilized in a wireless receiver, the receiving circuit comprising a programmable gain amplifier and a mixer module, the method comprising:

comparing a gain code of the programmable gain amplifier with a predetermined code range, wherein the gain code is determined by a frequency signal received through the mixer module; and adjusting a gain of the mixer module when the gain code is out of the predetermined code range.

8. The method of claim 7, wherein the gain code represents a gain of the programmable gain amplifier caused by the frequency signal received through the mixer module, and the predetermined code range corresponds to an operating gain range of the programmable gain amplifier.

9. The method of claim 7, wherein a total gain of the receiving circuit is designed to a predetermined value.

10. The method of claim 7, wherein the step of adjusting the gain of the mixer module further comprises:

increasing the gain of the mixer module if the gain code is larger than an upper bound of the predetermined code range; and decreasing the gain of the mixer module if the gain code is smaller than a lower bound of the predetermined code range.

11. The method of claim 7, wherein the wireless receiver is a Global Navigation Satellite System (GNSS) receiver, and the receiving circuit is a radio frequency integrated circuit.

12. A wireless receiver with automatic gain control, comprising:

a receiving circuit comprising:
   a low noise amplifier, for amplifying a radio frequency signal;
   a mixer module, for processing the amplified radio frequency signal to generate an intermediate frequency signal; and
   a programmable gain amplifier, for amplifying the intermediate frequency signal with a gain corresponding to a gain code; and a control circuit, for comparing the gain code with a predetermined code range and adjusting a gain of the low noise amplifier in operation when the gain code is out of the predetermined code range;

wherein the low noise amplifier in operation has a first gain value before the control circuit adjusts the gain of the low noise amplifier in operation, and the low noise amplifier in operation has a second gain value after the control circuit adjusts the gain of the low noise amplifier in operation.

13. The wireless receiver of claim 12, wherein the predetermined code range corresponds to an operating gain range of the programmable gain amplifier.

14. The wireless receiver of claim 12, wherein a total gain of the receiving circuit is designed to a predetermined value.

15. The wireless receiver of claim 12, wherein the control circuit is arranged to increase the gain of the low noise amplifier if the gain code is larger than an upper bound of the predetermined code range, and decrease the gain of the low noise amplifier if the gain code is smaller than a lower bound of the predetermined code range.

16. The wireless receiver of claim 12, wherein the control circuit is a baseband circuit, the receiving circuit is a radio frequency integrated circuit and further comprises a filter module coupled between the mixer module and the programmable gain amplifier.

17. The wireless receiver of claim 12, being a Global Navigation Satellite System (GNSS) receiver.

18. A wireless receiver with automatic gain control, comprising:

a receiving circuit, comprising:
   a mixer module, for processing a radio frequency signal to generate an intermediate frequency signal; and
   a programmable gain amplifier, for amplifying the intermediate frequency signal with a gain corresponding to a gain code; and a control circuit, for comparing the gain code with a predetermined code range and adjusting a gain of the mixer module when the gain code is out of the predetermined code range.

19. The wireless receiver of claim 18, wherein the predetermined code range corresponds to an operating gain range of the programmable gain amplifier.

20. The wireless receiver of claim 18, wherein a total gain of the receiving circuit is designed to a predetermined value.

21. The wireless receiver of claim 18, wherein the control circuit is arranged to increase the gain of the mixer module if the gain code is larger than an upper bound of the predetermined code range, and decrease the gain of the mixer module if the gain code is smaller than a lower bound of the predetermined code range.

22. The wireless receiver of claim 18, wherein the control circuit is a baseband circuit, the receiving circuit is a radio frequency integrated circuit and further comprises an filter module coupled between the mixer module and the programmable gain amplifier.

23. The wireless receiver of claim 18, being a Global Navigation Satellite System (GNSS) receiver.

* * * * *